US008829987B2

(12) United States Patent
Marien (10) Patent No.: US 8,829,987 B2
(45) Date of Patent: *Sep. 9, 2014

(54) MODULATION AND DEMODULATION CIRCUIT

(75) Inventor: Dirk Marien, Ranst (BE)

(73) Assignee: Vasco Data Security, Inc, Oakbrook, Terrace, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/349,070

(22) Filed: Jan. 12, 2012

(65) Prior Publication Data

US 2012/0112831 A1   May 10, 2012

Related U.S. Application Data

(63) Continuation of application No. 12/501,213, filed on Jul. 10, 2009, now Pat. No. 8,115,538.

(51) Int. Cl.
*H03D 1/08* (2006.01)
*H03D 1/10* (2006.01)
*H04L 27/06* (2006.01)
*G06K 19/07* (2006.01)

(52) U.S. Cl.
CPC ............... *H04L 27/06* (2013.01); *H03D 1/08* (2013.01); *G06K 19/0723* (2013.01); *H03D 1/10* (2013.01); *H03D 2200/0011* (2013.01); *H03C 2200/0058* (2013.01)
USPC .............................. 329/347; 327/62; 340/10.1

(58) Field of Classification Search
USPC ..................... 329/347, 370; 327/58, 61, 62; 340/10.1–10.5
See application file for complete search history.

(56) References Cited

U.S. PATENT DOCUMENTS

| | | |
|---|---|---|
| 5,587,824 A | 12/1996 | Asprey |
| 5,666,055 A | 9/1997 | Jones et al. |
| 6,362,738 B1 | 3/2002 | Vega |
| 7,019,509 B2 | 3/2006 | Kant |
| 7,236,002 B2 | 6/2007 | Salzmann |
| 7,375,578 B1 | 5/2008 | Blanchard |
| 7,378,817 B2 | 5/2008 | Calhoon |
| 7,392,059 B2 | 6/2008 | White |

(Continued)

FOREIGN PATENT DOCUMENTS

| | | |
|---|---|---|
| CN | 1606249 | 4/2005 |
| CN | 201003413 | 1/2008 |

OTHER PUBLICATIONS

Sedra et al., "Microelectronic Circuits: The Oxford Series in Electrical and Computer Engineering", Oxford University Press, 2004, ISBN: 0195142519, pp. 1099.*

(Continued)

*Primary Examiner* — Ryan Johnson
(74) *Attorney, Agent, or Firm* — RatnerPrestia (57) ABSTRACT

The invention relates to modulation and demodulation circuits, such as envelope detectors used to demodulate amplitude-modulated (AM) signals. By coupling an analog circuit to a port of a digital component, a compact envelope detector can be obtained, which achieves demodulation of AM signals for direct coupling into a digital input port. Accordingly, a compact envelope detector may be used in the data receiving part of a sealed device requiring post-manufacturing data transfer, in combination with additional components that provide electromagnetic coupling, such as inductive, capacitive, or radiative. An example of such a device is a credit card sized authentication token.

25 Claims, 4 Drawing Sheets

(56) References Cited

U.S. PATENT DOCUMENTS

| | | |
|---|---|---|
| 7,710,238 B2 | 5/2010 | Jei et al. |
| 2007/0170985 A1* | 7/2007 | Arisawa .......................... 330/10 |
| 2008/0252459 A1 | 10/2008 | Butler et al. |
| 2009/0108992 A1 | 4/2009 | Shafer |
| 2009/0134979 A1 | 5/2009 | Tsukamoto et al. |

OTHER PUBLICATIONS

Microchip Technology, Inc., "microID 13.56 MHz RFID System Design Guide", DS21299E, 2004.*

International Application Serial No. PCT/US2010/041490, International Search Report mailed Sep. 16, 2010, 3 pgs.

Bapat, Vivek, "RFID in Manufacturing", Rockwell Automation Global Manufacturing Solutions, (Oct. 2004), 20 pgs.

Translation of Chinese Office Action for CN201080030816.9 dated Jan. 13, 2014.

Translation of Search Report for CN201080030816.9 dated Dec. 31, 2013.

* cited by examiner

MODULATION AND DEMODULATION CIRCUIT

CROSS REFERENCE TO RELATED APPLICATIONS

This application is a continuation of co-pending U.S. application Ser. No. 12/501,213, MODULATION AND DEMODULATION CIRCUIT, filed Jul. 10, 2009, the contents being incorporated in its entirety by reference herein. Co-pending U.S. application Ser. No. 12/210,691, METHOD FOR POST-MANUFACTURING DATA TRANSFER TO AND FROM A SEALED DEVICE, discloses a method for post-manufacturing data transfer to and from a sealed device, the contents being incorporated in its entirety by reference herein.

TECHNICAL FIELD

The present invention relates to the field of modulation and demodulation circuits, such as envelope detectors used to demodulate amplitude-modulated (AM) signals and amplitude-shift-keying (ASK) signals.

BACKGROUND

It is a generally known principle of radio engineering that an amplitude-modulated signal can be demodulated by means of an envelope detector. An envelope detector is a relatively simple electronic circuit, the essential components of which are a diode, a capacitor, and a resistor. The circuit is laid out in such a way that the capacitor is allowed to be charged very quickly by the incoming signal over the forwardly polarized diode during at most a quarter-period of the incoming signal (e.g. the positive part of the rising edge of a carrier wave cycle), after which the capacitor discharges more slowly over the resistor for the remainder of the period, where the reversal of the diode's polarization inhibits a more rapid discharge. When the amplitude envelope decreases, the discharging phase continues until the voltage over the capacitor intercepts a rising edge of the incoming signal.

The electrical voltage over the capacitor thus roughly follows the peaks of the incoming signal, with a ripple determined by the time constant characteristic of the combination of the capacitor and the resistor. This time constant is given by $\tau=RC$, where R is the resistance of the resistor and C is the capacitance of the capacitor.

One more particular way of obtaining an envelope detector consists of combining a clamp circuit with an additional capacitor and a resistor, such that the incoming signal is first "clamped" to a certain non-zero bias level, which we can assume without loss of generality to be positive, after which the voltage over the capacitor, which has an averaging effect, approximately represents the envelope of the original incoming signal.

Amplitude-shift keying (ASK) is a digital modulation technique in which information is coded into an alphabet of symbols represented by bursts of a sinusoidal signal with different amplitudes. In its simplest form, binary ASK codes one bit per symbol, represented by two different amplitude levels. The ratio of the respective amplitude levels is a design choice. Optionally, one of these amplitude levels is zero; the resulting modulation scheme may be described as on/off signaling. Binary ASK may directly encode bit values '1' and '0' to different amplitude levels, or use a more complex coding scheme such as Manchester encoding, run-length encoding, and other alternatives known in the art.

Examples of wireless digital transmission systems that use binary ASK transmission are contactless smart cards and radio-frequency identification (RFID) systems. These are highly miniaturized systems. Some components of these systems are entirely passive, in that the component obtains both operating power and the signal to be received from the electromagnetic fields emitted by the transmitter. Others have their own operating power sources. These systems typically receive the ASK modulated signal from the transmitter via inductive coupling in the near field.

In a typical ASK reception circuit, the output of an envelope detector is passed through an analog-to-digital convertor (ADC) and fed into a digital circuit or component that processes the binary information contained in the received signal.

DISCLOSURE OF THE INVENTION

A general problem to be solved in the context of miniaturized devices with wireless radio-frequency communication capabilities is to provide very small, robust, and cost-effective radio-frequency signal receiving and sending circuits for interconnection with a digital processing circuit or component. Preferably, the receiving and sending circuits consist of a small number of commercially available components. Preferably, there is a synergy between the sending and receiving circuit.

To simplify synthesis and analysis of electronic circuits, a complete electronic circuit is usually conceptually divided into an analog part and a digital part, where the digital part consists of interconnected components which perform functions which are specified with digital nomenclature. The aim of this division is to allow independent treatment of both parts, so that the analog part can be analyzed without having to worry about the details of the components making up the digital part, and so that the digital part can be analyzed on a digital abstraction level while ignoring any analog effects produced by the parts of the digital part of the circuit. Thanks to this strict conceptual division, the behavior and interaction of the interconnected digital components can be analyzed on a digital abstraction level that is oblivious to any analog effects of the physical structures that make up the digital circuits.

However, digital circuits, including integrated circuits (ICs), are made from elements which do have effects which can be described with analog nomenclature. It is an object of this invention to use the analog properties of elements present in a digital circuit of a device, to play a role in performing an analog function of the device, in order to make the remaining analog circuitry more compact or simpler or both. The present invention thus abandons the strict division between the analog and digital part of a circuit, to advantageously exploit the analog properties of elements which are normally employed to perform functions specified with digital nomenclature.

The present invention is based on the insight that an ASK demodulation circuit used to demodulate a digital signal, can advantageously use the characteristics of the ports of a digital component (components which are provided to perform functions specified with digital nomenclature) to eliminate the need for a separate, discrete diode. More specifically, it is based on the insight that the analog behavior of the port of a digital component is, within certain voltage and current boundaries, equivalent to that of a diode.

The ports of a digital component such as a microprocessor typically host circuitry that protects the logic of the digital component against unsafe voltages, such as unintentional electrostatic discharges, that might be applied to the input.

Such unsafe voltages are not expected during normal operation of the digital component, and their exceptional occurrence would typically not be taken into account by the person skilled in the art of digital circuit design. One typical protective assembly links the port to the system ground $V_{GND}$ via a first diode, where the anode of the first diode connects to the system ground, and links the port to the system supply voltage $V_{DD}$ via a second diode, where the cathode of the second diode connects to the system supply voltage.

The person skilled in the art of electronics will understand that an assembly of that kind limits the electrical voltage on the port to approximately the range between $V_{GND}-V_d$ and $V_{DD}+V_d$, where $V_d$ is the forward electrical potential difference of the diode's junction, typically around 0.6 V to 0.7 V. The operation of the assembly is such that any electrical voltage applied to the port outside the cited range, would imply an electrical current to one of the reference points that would be too large to be sustained by the generator of the voltage. The assembly may be improved by adding current-limiting resistors.

Similar results may be obtained by judiciously connecting a transistor, such as a metal-oxide-semiconductor field-effect transistor (MOSFET), to the port and the reference voltage levels $V_{GND}$ and $V_{DD}$.

Where a port of the digital component exhibits a diode-like voltage-current characteristic as described above, regardless of whether its internal implementation actually contains any diodes, such a port may advantageously be used to fulfill the role of a diode that would otherwise have to be present in an adjacent analog circuit. This is in particular the case where the analog circuit requires the presence of a diode the anode of which would be connected to $V_{GND}$. In other words the diode that would otherwise be required can be eliminated by simply connecting the circuit to the port.

More particularly an envelope detector for binary ASK demodulation, the digital output signal of which is to be processed by a microprocessor, may advantageously be connected to an otherwise unused port of said microprocessor, to employ the virtual diode-to-ground termination provided by this port, thus eliminating the need for a separate external diode. If multiple digital components are present, an unused port of any other digital component may serve the purpose of providing the virtual diode-to-ground termination. Optionally, the combination of the sending circuit, the receiving circuit, and the envelope detector is dimensioned in such a way that the envelope voltages, when connected to a digital input port of said microprocessor, qualify as digital '1' and digital '0', such that the envelope detector also performs the function of the ADC which might otherwise also be required. This result is based on the insight that for the detection of a strictly binary envelope signal, a single comparison to a threshold level suffices for each symbol, and this threshold can be made to coincide with the high/low detection threshold of a digital input port.

The input protection circuitry of the digital component thus becomes part of the envelope detector. The discrete part of the envelope detector circuit, i.e. the envelope detector circuit without the diode, will hereinafter be referred to as the "reduced envelope detector circuit".

In one form a preferred embodiment of the present invention differentiates itself from the prior art inter alia because it no longer observes a strict distinction between the analog part and the digital part of the circuit at the level of individual circuit nodes. Rather, it involves employing a digital component (a component which is provided to perform functions specified with digital nomenclature), or parts of that component, to perform a function of the system which is defined by analog nomenclature, by relying on secondary analog behavior of the digital component.

It should be noted that it is, in general, not desirable that the digital port used for providing diode functionality have any other influence on the circuit. Such a functional decoupling can be obtained by putting the port in a high-impedance state (also known as "Hi-Z"), if the digital component supports three-state logic.

Inductive coupling in the near field may be achieved by adding an inductor and a capacitor as an LC circuit at the input of the demodulation circuit. The inductor with inductance L is chosen for its ability to convert the varying magnetic flux emitted by a nearby apparatus into an electrical current. The capacitor is chosen such that the circuit will exhibit electrical resonance at a chosen frequency f, the carrier frequency of the incoming signal, which requires a capacitance $C'=1/(4\pi^2 f^2 L)$, if the minor effect of stray resistance is ignored.

Having thus addressed the problem of providing a wireless receiver with an envelope detector, it is a further object of the present invention to provide a wireless transmitter. The wireless transmitter of the present invention is based on the insight that the circuit described above, interconnected with a digital port as described above, may be used as a near-field transmitter according to the "backscattering" concept.

Modulation of the backscattered wave can be achieved by repeatedly modifying the reactance of the LC circuit. As the LC circuit of the apparatus of the present invention is inductively coupled to the transmitting circuit of a nearby source apparatus, the impedance to be overcome by the carrier wave generator of the source apparatus will vary as a function of the reactance offered by the apparatus of the present invention. This variation can be detected by the source apparatus, thus providing a communication channel from the apparatus of the present invention back to the source apparatus.

Figure 6:
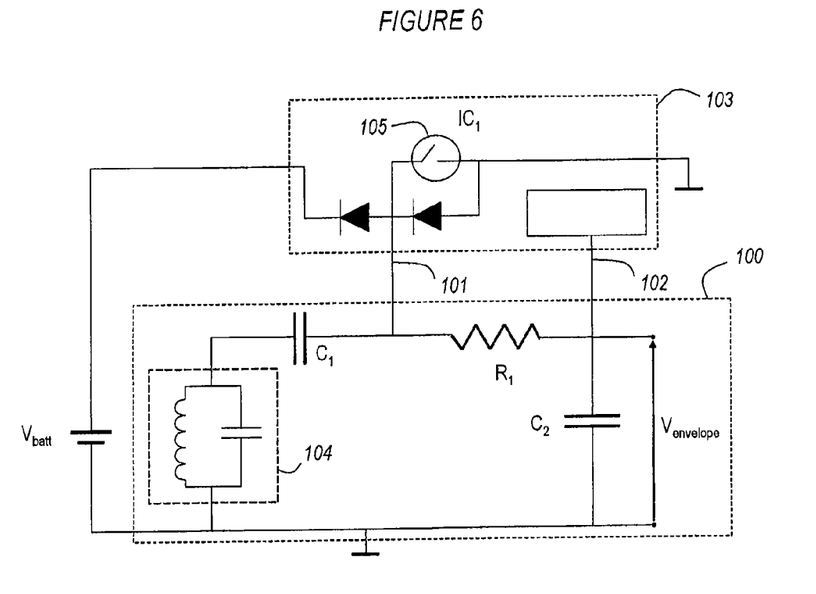
FIG. 6 shows the schematic of another embodiment according to the invention.

If the LC circuit is perfectly tuned to the frequency $f_0$ of the incident wave, its impedance, as a function of frequency exhibits a global minimum at $f_0$; this is the impedance towards the incident wave, for which the LC circuit is a serial LC circuit. If the parallel LC circuit is within inductive coupling range, the combined impedance of the source apparatus's tuned circuit and the coupled LC circuit of the apparatus of the present invention exhibits a local minimum at $f_0$. If the parallel LC circuit is within inductive coupling range, and detuned from the frequency of the incident wave, this will have the effect of changing the impedance at the frequency of the incident wave to a value different from the value at the local minimum—the local minimum shifts to a different frequency; as such, detuning the LC circuit presents a detectable change of impedance to the source apparatus. With reference to FIG. 6, the LC circuit 104 can be detuned at will, inter alia, by creating a short circuit between the reference point at port 101 and the system ground, which has the effect of placing capacitor $C_1$ in parallel with LC circuit 104 and thus removing the influence of $R_1$ and $C_2$. The present invention accomplishes the equivalent of the short circuit by switching port 101 of digital component 103 to its "low" or "off" state, which is near or equal to the system ground reference point. An advantage of using port 101 in this way, is that the modulation of the backscattering channel can be directly controlled by the digital component without requiring any additional Digital-to-Analog Conversion circuitry.

Advantageous Effects

By judiciously coupling an analog circuit comprising one resistor and two capacitors which are judiciously dimensioned to an otherwise unused port of a digital component, hereinafter the "diode port", an extremely compact envelope detector can be obtained, which achieves demodulation of a binary ASK signal for direct coupling into a digital input port. Preferably, the diode port and the input port are ports of the same digital component, thus reducing the total number of components needed.

Such a very compact envelope detector may advantageously be used in the data receiving part of a sealed device requiring post-manufacturing data transfer, in combination with additional components that provide electromagnetic coupling, such as inductive coupling, capacitive coupling, or radiative coupling. An example of such a device is a credit card sized authentication token, the electrical personalization of which happens after the production of the card-like housing. Such tokens are typically constructed as an inlay in a laminated housing, whereby the outside of the housing is devoid of any ohmic contacts to the components of the inlay.

In another aspect of the invention, the diode port is additionally used to modulate a backscattered wave, by switching the voltage of the diode port to the system ground level. In this way, the apparatus is advantageously equipped with a wireless bidirectional half-duplex transmission system.

BRIEF DESCRIPTION OF THE DRAWINGS

The foregoing and other features and advantages of the invention will be apparent from the following, more particular description of several embodiments of the invention, as illustrated in the accompanying drawings.

Figure 1:
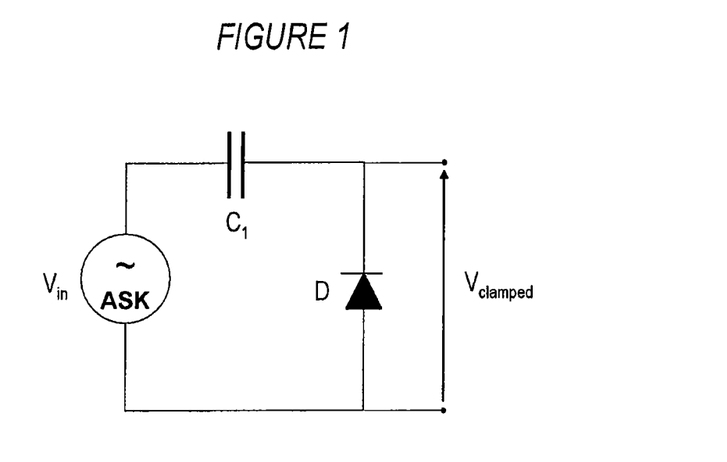
FIG. 1 shows the schematic of a standard clamp circuit.

Referring first to FIG. 1, the figure illustrates the standard clamp circuit consisting of a capacitor $C_1$ and a diode D transforming an input voltage signal $V_{in}$ into its clamped counterpart at reference point $V_{clamped}$. The input voltage signal $V_{in}$ is assumed to be amplitude-modulated (modulating circuitry, transmission channel, and receiving circuitry are not separately shown).

Figure 2:
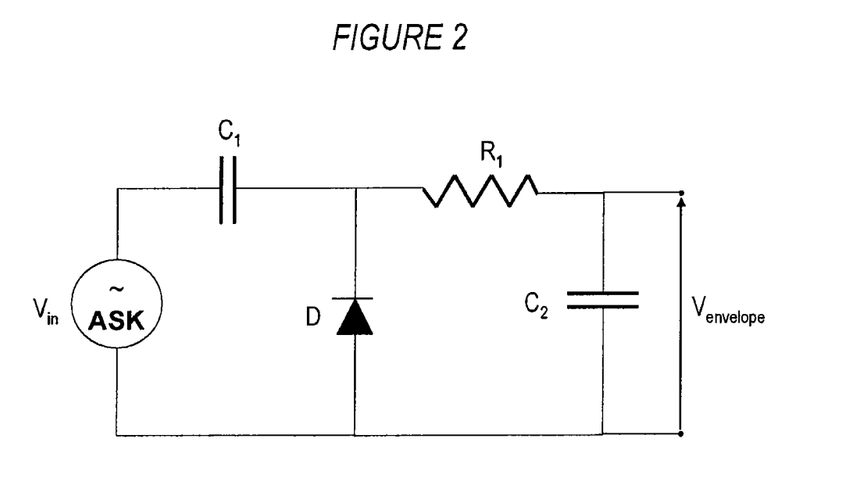
FIG. 2 shows the schematic of a combination of a clamp circuit and an envelope detector.

FIG. 2 shows the combination of a clamp circuit and an envelope detector. In FIG. 2 the additional capacitor $C_2$ and the resistor $R_1$ are used to obtain the incoming signal's envelope $V_{envelope}$. The input voltage signal $V_{in}$ is assumed to be amplitude-modulated (modulating circuitry, transmission channel, and receiving circuitry are not separately shown).

Figure 3:
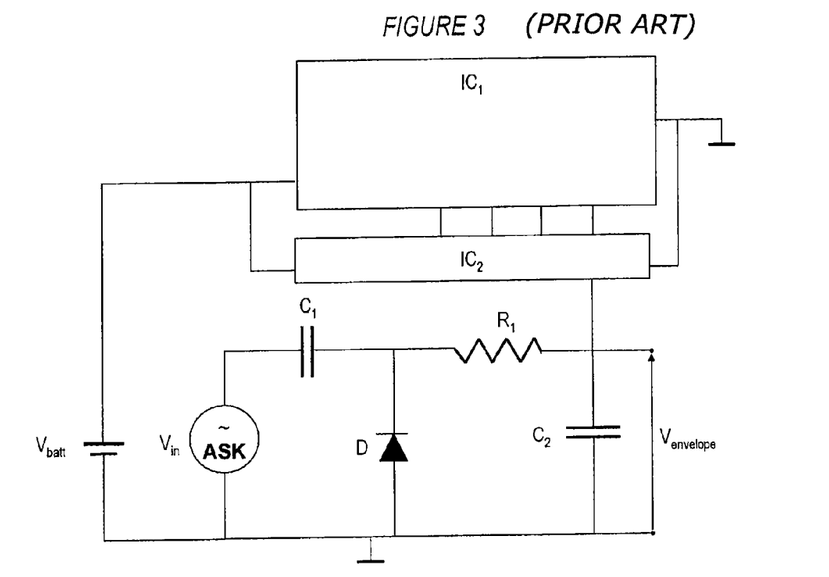
FIG. 3 shows the schematic of an exemplary circuit according to the prior art including an envelope detector.

In FIG. 3 $IC_1$ is the digital component that processes the incoming digital data. The input voltage signal $V_{in}$ is assumed to be amplitude-modulated in quaternary ASK (modulating circuitry, transmission channel, and receiving circuitry are not separately shown). The analog envelope detection circuit detects the envelope of the amplitude-modulated signal, and passes it to the analog-to-digital converter $IC_2$, shown here with a 4-bit output. The output of $IC_2$ is connected to the input of $IC_1$.

Figure 4:
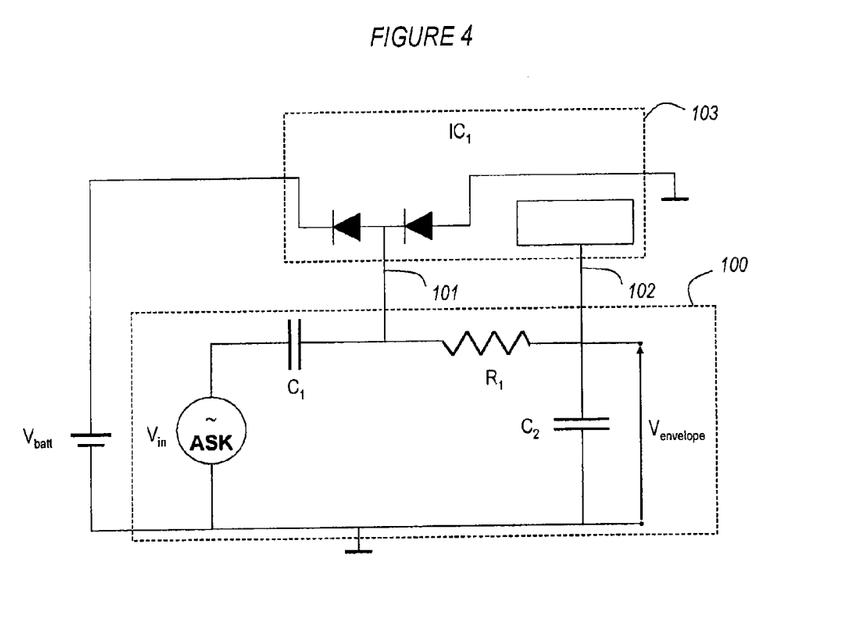
FIG. 4 shows the schematic of an embodiment of the invention.

Referring to FIG. 4, $IC_1$ is a digital component 103 of which two ports are shown; a first port 101 is used as a "diode port", providing a diode-to-ground termination, and a second port 102 is the actual digital input port used to process the demodulated received signal provided by the circuit 100. The input voltage signal $V_{in}$, is assumed to be amplitude-modulated in binary ASK (modulating circuitry, transmission channel, and receiving circuitry are not separately shown).

More particularly, in a preferred embodiment the apparatus for processing an electrical signal comprises a reduced envelope detector circuit 100 and a microprocessor 103, wherein a first node of said reduced envelope detector circuit is coupled to a first port 102 of said microprocessor, the electrical voltage at said first node being representative of the envelope of said electrical signal, and wherein a second node of said reduced envelope detector circuit is coupled to a second port 101 of said microprocessor, said second port being used to complete said reduced envelope detector circuit by providing the electrical equivalent of a diode coupled to the system ground reference point, the anode of said electrical equivalent of a diode being coupled to the system ground reference voltage and the cathode of said electrical equivalent of a diode being coupled to said second node.

In a particular embodiment, the circuit is adapted to receive a 15 MHz signal modulated at 1 kHz. In a particular embodiment, the apparatus is adapted to receive a signal through inductive coupling at a distance of [⅕]" (0.005 m).

In a particular embodiment, the apparatus receives an incoming signal through near-field inductive coupling. Preferably, the apparatus comprises a tuned circuit 104. In one embodiment, said second port 101 of said microprocessor comprises a switch 105 adapted to selectively provide an output level equivalent to the system ground reference voltage in order to modulate a backscattered signal. Said switch 105 may comprise any combination of integrated components known to the person skilled in the art to offer the functionality of a switch, including one or more transistors.

Figure 5:
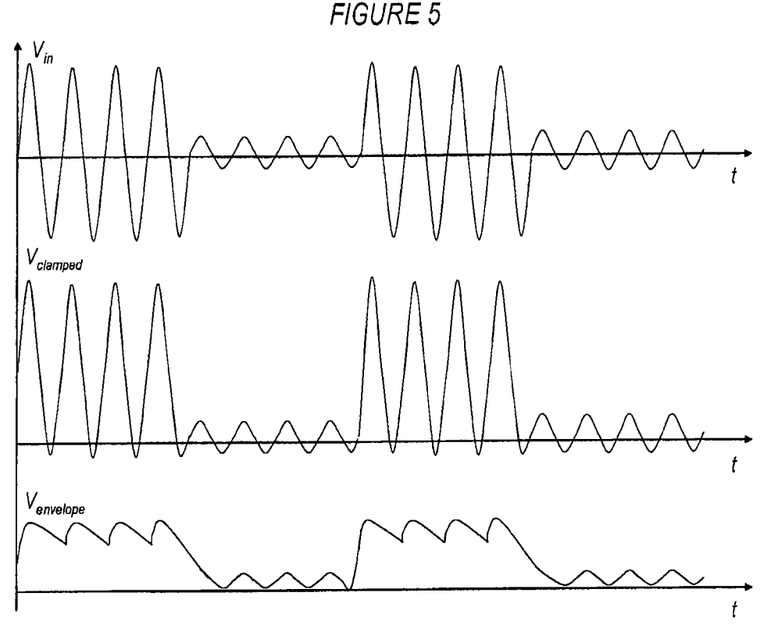
FIG. 5 is a time diagram of the signals, in terms of voltages, that would be measured at various reference points in the circuits of the previous Figures.

FIG. 5 illustrates pertinent waveforms. The first signal, $V_{in}$, is an exemplary signal carrying binary data in amplitude-shift-keying (ASK) modulation. The second signal, $V_{clamped}$, is the signal that would be measured at the output of the clamping circuit. The third signal, $V_{envelope}$ is the signal that would be measured at the output of the envelope detector. The number of cycles per symbol, the modulation depth, and the ripple of the demodulated signal as shown in this Figure have been chosen arbitrarily for illustrative purposes, and do not necessarily reflect preferred system parameters.

FIG. 6 illustrates a further embodiment. As seen there $IC_1$ is a digital component 103 of which two ports are shown; a first port 101 is used as a "diode port", providing a diode-to-ground termination and a transmission modulation switch 105, and a second port 102 is the actual digital input port used to process the demodulated received signal provided by the circuit 100. The input signal is received by the tuned circuit 104 through near-field inductive coupling. The output signal, consisting of a backscattered version of the incident carrier wave modulated by transmission modulation switch 105, is also emitted by the tuned circuit 104 through near-field inductive coupling.

A general embodiment of the apparatus for processing an electrical signal according to the present invention comprises a circuit 100 for demodulating said signal and one or more digital components 103, wherein said circuit 100 is coupled to a first port 102 of one of said one or more digital components 103 for providing a demodulated signal from said circuit to said digital component, and wherein said circuit is further coupled to a second port 101 of one of said one or more digital components 103 for providing the electrical equivalent of a diode connected to a reference voltage.

In one embodiment of the apparatus of the present invention, said circuit 100 does not include a diode associated with the demodulation function.

In another embodiment of the apparatus of the present invention, said first port 102 and said second port 101 are ports of the same digital component 103. In a specific embodiment of the apparatus of the present invention, said digital component 103 is a microprocessor.

In yet another embodiment of the apparatus of the present invention, said electrical signal is modulated in amplitude modulation. In one particular embodiment of the apparatus of the present invention, said electrical signal is modulated in amplitude shift keying. In one more particular embodiment of the apparatus of the present invention, said electrical signal is modulated in binary amplitude shift keying.

In a further embodiment of the apparatus of the present invention, said reference voltage is the system ground voltage.

In still a further embodiment of the apparatus of the present invention, said reference voltage is the system power supply voltage.

In another embodiment of the apparatus of the present invention, said circuit 100 is a reduced envelope detector.

In one embodiment, said second port 101 comprises a switch 105 adapted to selectively provide an output level equivalent to a reference voltage for modulating a backscattered signal.

In one embodiment the electrical signal has a carrier frequency of about 16 MHz, and the signal is modulated at a rate of 1 kHz.

In one embodiment the signal is received via inductive coupling where the coupling distance is about 0.005 meters.

In one embodiment wherein a second port of a digital circuit provides the electrical equivalent of a diode and where the circuit employs inductive coupling, a tuned circuit is employed. In this embodiment a switch or switching assembly is used to modulate the reactance of the tuned circuit. In this embodiment the switching assembly is integrated into the second port.

While various embodiments of the present invention have been described above, it should be understood that they have been presented by way of example only, and not limitation. Thus, the breadth and scope of the present invention should not be limited by any of the above described exemplary embodiments but should be defined only in accordance with the following claims and their equivalents.

The invention claimed is:

1. An apparatus for processing a modulated electrical signal, the apparatus comprising:
at least one digital component having a first port and a second port, the second port providing the electrical equivalent of a diode connected to a reference voltage; and
an analog circuit for receiving and demodulating the modulated electrical signal, the analog circuit coupled to the first port and the second port of the at least one digital component, the received modulated electrical signal clamped to the reference voltage by the electrical equivalent of a diode in the at least one digital component, the analog circuit configured to provide the demodulated signal to the first port.

2. The apparatus of claim 1, wherein said first and second ports are ports of the same digital component.

3. The apparatus of claim 1, wherein the at least one digital component comprises a microprocessor.

4. The apparatus of claim 1, wherein said modulated electrical signal is amplitude modulated.

5. The apparatus of claim 4, wherein said modulated electrical signal is amplitude shift keying modulated.

6. The apparatus of claim 5, wherein said modulated electrical signal is binary amplitude shift keying modulated.

7. The apparatus of claim 1, wherein said reference voltage is a system ground voltage.

8. The apparatus of claim 1, wherein said reference voltage is a system power supply voltage.

9. The apparatus of claim 1, wherein said analog circuit is a reduced envelope detector.

10. The apparatus of claim 1, wherein said modulated electrical signal has a carrier frequency of approximately 16 MHz.

11. The apparatus of claim 1, wherein said modulated electrical signal is modulated at a baud rate of 1 kHz.

12. The apparatus of claim 1, wherein said modulated electrical signal is received through inductive coupling.

13. The apparatus of claim 12, wherein the coupling distance is approximately 0.005 meter.

14. The apparatus of claim 12, further comprising:
a tuned circuit for effectuating said inductive coupling.

15. The apparatus of claim 14, further comprising:
a switching assembly for modulating the reactance of said tuned circuit.

16. The apparatus of claim 15, wherein said switching assembly is integrated in said second port.

17. The apparatus of claim 1, wherein the analog circuit comprises discrete analog components.

18. The apparatus of claim 17, wherein the analog circuit for demodulating is a reduced envelope detector.

19. The apparatus of claim 18, wherein the reduced envelope detector does not include a diode.

20. The apparatus of claim 19, wherein the reduced envelope detector in combination with the electrical equivalent of a diode forms an envelope detector.

21. The apparatus of claim 1, wherein the at least one digital component is a single integrated circuit.

22. The apparatus of claim 1, wherein the circuit is an analog circuit, the at least one digital component is a microprocessor, and the first port is a digital input port and wherein the analog circuit provides the demodulated signal directly to the digital input port.

23. An apparatus for processing a modulated electrical signal, the apparatus comprising:
a microprocessor having a first port and a second port, the second port providing the electrical equivalent of a diode connected to a reference voltage; and
an analog circuit for receiving and demodulating the modulated electrical signal, the analog circuit including a first node coupled directly to the first port and a second node coupled directly to the second port, the received modulated electrical signal clamped to the reference voltage at the second node by the electrical equivalent of the diode in the microprocessor, the analog circuit configured to provide the demodulated signal via the first node to the first port of the microprocessor.

24. The apparatus of claim 23, wherein the microprocessor comprises a transmission modulation switch in parallel with the electrical equivalent of the diode.

25. The apparatus of claim 24, wherein the modulated electrical signal is modulated on a carrier wave, the reduced envelope detection circuit further comprises a tuned circuit, and the tuned circuit is configured to receive an incident carrier wave carrying the modulated electrical signal and to transmit a backscattered version of the incident carrier wave modulated by the transmission modulation switch in the microprocessor.

\* \* \* \* \*